(12) United States Patent
Lou et al.

(10) Patent No.: US 10,903,303 B2
(45) Date of Patent: Jan. 26, 2021

(54) DISPLAY PANEL WITH A SEPARATION PILLAR HAVING SLANTING SIDE SURFACES DISPOSED ON A PIXEL DEFINITION LAYER

(71) Applicants: YUNGU (GU'AN) TECHNOLOGY CO., LTD., Langfang (CN); Kunshan Go-Visionox Opto-Electronics Co., Ltd., Kunshan (CN); KUNSHAN VISIONOX TECHNOLOGY CO., LTD., Kunshan (CN)

(72) Inventors: Junhui Lou, Kunshan (CN); Yanan Ji, Kunshan (CN); Yanqin Song, Kunshan (CN); Leping An, Kunshan (CN); Shixing Cai, Kunshan (CN); Li Lin, Kunshan (CN)

(*) Notice: Subject to any disclaimer, the term of this patent is extended or adjusted under 35 U.S.C. 154(b) by 0 days.

(21) Appl. No.: 16/801,181

(22) Filed: Feb. 26, 2020

(65) Prior Publication Data

US 2020/0194538 A1 Jun. 18, 2020

Related U.S. Application Data

(63) Continuation of application No. PCT/CN2019/085577, filed on May 5, 2019.

(30) Foreign Application Priority Data

Aug. 6, 2018 (CN) .......................... 2018 1 0887652

(51) Int. Cl.
*H01L 51/00* (2006.01)
*H01L 33/00* (2010.01)
(Continued)

(52) U.S. Cl.
CPC ...... *H01L 27/3283* (2013.01); *H01L 27/3227* (2013.01); *H01L 27/3234* (2013.01);
(Continued)

(58) Field of Classification Search
CPC ............ H01L 27/3283; H01L 27/3227; H01L 27/3234; H01L 27/3246; H01L 27/3267; H01L 27/3286; H01L 27/3295
See application file for complete search history.

(56) References Cited

U.S. PATENT DOCUMENTS 6,768,257 B1 * 7/2004 Yamada .............. H01L 27/1214
313/504
9,147,721 B2 * 9/2015 Hong .................. H01L 27/3272
(Continued)

FOREIGN PATENT DOCUMENTS

CN   202693831 U   1/2013
CN   105807484 A   7/2016
(Continued)

*Primary Examiner* — Alonzo Chambliss
(74) *Attorney, Agent, or Firm* — Kilpatrick Townsend & Stockton

(57) ABSTRACT

The present disclosure relates to a display panel, a display screen, and a terminal device. The display panel includes a substrate, a first pixel electrode overlaying the substrate, a pixel definition layer overlaying a side of the first pixel electrode away from the substrate and including a plurality of pixel openings to expose a surface of the first pixel electrode, and a first type of separation pillar disposed on the pixel definition layer. A width of the first type of separation pillar changes continuously or intermittently in an extending direction thereof. The extending direction of the first type of separation pillar is parallel to the substrate. The width is a dimension of a projection of the first type of separation pillar on the substrate in a direction perpendicular to the extending direction of the first type of separation pillar.

16 Claims, 9 Drawing Sheets

US 10,903,303 B2
Page 2

(51) Int. Cl.
*H01L 31/0232* (2014.01)
*H01L 21/00* (2006.01)
*H01L 51/40* (2006.01)
*H01L 27/32* (2006.01)

(52) U.S. Cl.
CPC ...... *H01L 27/3246* (2013.01); *H01L 27/3267* (2013.01); *H01L 27/3286* (2013.01); *H01L 2227/323* (2013.01)

(56) References Cited

U.S. PATENT DOCUMENTS

| | | | |
|---|---|---|---|
| 9,316,842 B2 | 4/2016 | Huang | |
| 9,853,241 B2* | 12/2017 | Bi | H01L 27/3211 |
| 2010/0033084 A1* | 2/2010 | Ko | H01L 27/3246 |
| | | | 313/504 |
| 2015/0004375 A1* | 1/2015 | Hou | H01L 51/0014 |
| | | | 428/195.1 |
| 2015/0362776 A1 | 12/2015 | Jikumaru et al. | |
| 2017/0062528 A1* | 3/2017 | Aoyama | G02F 1/133514 |
| 2017/0185180 A1* | 6/2017 | Chae | G06F 3/044 |
| 2017/0207277 A1* | 7/2017 | Park | G06F 3/0412 |
| 2018/0113545 A1* | 4/2018 | Shim | G02F 1/13338 |
| 2019/0081129 A1* | 3/2019 | Sung | H01L 51/5253 |
| 2019/0165305 A1 | 5/2019 | Zhang | |
| 2019/0326359 A1* | 10/2019 | Yang | G06F 3/0412 |
| 2020/0273921 A1* | 8/2020 | Park | H01L 27/323 |

FOREIGN PATENT DOCUMENTS

| | | |
|---|---|---|
| CN | 106463080 A | 2/2017 |
| CN | 108010943 A | 5/2018 |
| CN | 208608202 U | 3/2019 |
| CN | 209071332 U | 7/2019 |
| JP | 2002221730 A | 8/2002 |

* cited by examiner

DISPLAY PANEL WITH A SEPARATION PILLAR HAVING SLANTING SIDE SURFACES DISPOSED ON A PIXEL DEFINITION LAYER

CROSS-REFERENCES TO RELATED APPLICATIONS

This application is a continuation application of International Application PCT/CN2019/085577, filed on May 5, 2019, which claims the priority benefit of Chinese Patent Application No. 201810887652. X, titled "DISPLAY PANELS, DISPLAY SCREENS AND DISPLAY TERMINALS" and filed on Aug. 6, 2018. The entireties of these applications are incorporated by reference herein for all purposes.

TECHNICAL FIELD

The present disclosure relates to display technologies.

BACKGROUND

With the rapid development of electronic devices, the demand of users for screen-to-body ratio becomes increasingly higher, so that electronic devices with a full-screen display are attracting more and more attention in the industry. Conventional electronic devices, such as mobile phones, tablet PC and the like, require to integrate components such as a front-facing camera, an earphone, infrared sensing element, and the like, the full-screen display of the electronic device is usually achieved by notching on the display screen and providing a transparent display screen in the notched area.

SUMMARY

Exemplary embodiments of the present disclosure provide a display panel, a display screen, and a display terminal.

A display panel includes a substrate, a first pixel electrode overlaying the substrate, a pixel definition layer overlaying a side of the first pixel electrode away from the substrate, and a plurality of first type of separation pillars disposed on the pixel definition layer. The pixel definition layer includes a plurality of pixel openings to expose a portion of a surface of the first pixel electrode. A width of one of the first type of separation pillars changes continuously or intermittently in an extending direction of one of the first type of separation pillars. The extending direction of one of the first type of separation pillars is parallel to the substrate. The width is a dimension of a projection of one of the first type of separation pillars on the substrate in a direction perpendicular to the extending direction of one of the first type of separation pillars.

A display screen includes a first display area and the aforementioned display panel. The first display area is configured to display a picture. The display panel is disposed in the first display area.

A display terminal includes a device body and the aforementioned display screen. The device body has a device area. The display screen is disposed on the device body. The device area is located under the first display area and a photosensitive device is disposed in the device area.

DETAILED DESCRIPTION OF THE INVENTION

Reference will be made to the accompanying drawings and embodiments to describe the present disclosure in detail, so that the objects, technical solutions, and advantages of the present disclosure can be more apparent and understandable. It is understood that the specific embodiments described herein are merely illustrative of the present disclosure and are not intended to limit the present disclosure.

In the description of the present disclosure, it is to be understood that orientation or position relationships that are indicated by the terms "center", "transverse", "on", "under", "left", "right", "vertical", "horizontal", "top", "bottom", "inside", and "outside", and the like are orientation or position relationships shown based on the accompany drawings, and are merely for convenience of the description of the present disclosure and simplifying description, rather than indicating or implying that the indicated device or element must have a particular orientation or being constructed and operated in a particular orientation, and are therefore not to be construed as limitation of the present disclosure. In addition, the terms "first", "second", and the like are used for descriptive purposes only, and cannot be understood to indicate or imply relative importance or implicitly indicate the number of technical features indicated. Therefore, the defined "first" and "second" features may explicitly or implicitly include one or more of the features.

The inventors have found that when a photosensitive device such as a camera or the like is placed under a transparent display panel, the taken photos are blurred. The inventors have found after research that this problem is due to the presence of conductive traces in the display screen body of electronic devices. External light can generate diffraction phenomenon when passing through these conductive traces, and the diffraction intensity distribution is more complex, resulting in diffraction fringes, which would then affect the normal operation of the photosensitive device such as a camera or the like. For example, when the camera located under the transparent display area is in operation, external light can be obviously diffracted after passing through the wire material traces in the display screen, so that the picture captured by the camera is distorted.

Figure 1:
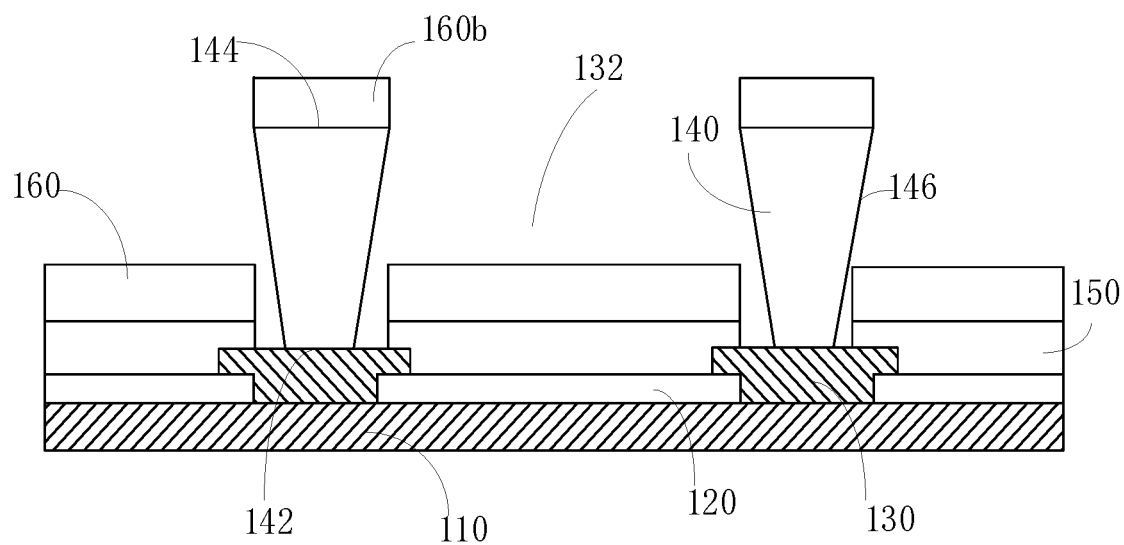
FIG. 1 is a cross-sectional view of a display panel in accordance with an exemplary embodiment.

In order to solve the aforementioned problem, an exemplary embodiment of the present disclosure provides a display panel. FIG. 1 is a cross-sectional view of a display panel in accordance with an exemplary embodiment. Referring to FIG. 1, the display panel includes a substrate 110, a first pixel electrode 120, a pixel definition layer 130, and a separation pillar 140.

The substrate 110 may be a rigid substrate or a flexible substrate. For example, the rigid substrate may be a transparent substrate such as a glass substrate, a quartz substrate, a plastic substrate or the like, and the flexible substrate may be a flexible polyimide (PI) substrate or the like.

The first pixel electrode 120 is formed on a substrate 110. There is a plurality of first pixel electrodes 120 arranged regularly on the substrate 110. In the present embodiment, one side of the substrate 110 on which the first pixel electrode 120 is formed is an upper side, and the opposite side thereof is a lower side. In the present embodiment, the display panel is a passive-matrix organic light-emitting diode (PMOLED) display panel. In an exemplary embodiment, in order to improve light transmittance of the display panel, each conductive trace of the display panel, such as the first pixel electrode 120, is made of a transparent conductive metal oxide. For example, the first pixel electrode 120 may be made of indium tin oxide (ITO) or indium zinc oxide (IZO). In addition, in order to reduce the resistance of each conductive trace on the basis of ensuring high light transmittance, the first pixel electrode 120 may also be made of materials such as aluminum-doped zinc oxide, silver-doped ITO, silver-doped IZO or the like.

In the present embodiment, the aforementioned display panel further includes a light emitting structure layer 150 formed on the first pixel electrode 120 and a second pixel electrode 160 formed on the light emitting structure layer 150. In an exemplary embodiment, in order to improve the light transmittance of the display panel, the second pixel electrode 160 may be made of a transparent conductive metal oxide. For example, the second pixel electrode 160 may be made of indium tin oxide (ITO) or indium zinc oxide (IZO). In addition, in order to reduce the resistance of each conductive trace on the basis of ensuring high light transmittance, the second pixel electrode 160 may also be made of materials such as aluminum-doped zinc oxide, silver-doped ITO, silver-doped IZO or the like. In an exemplary embodiment, the first pixel electrode 120 is an anode, and the second pixel electrode 160 is a cathode.

The pixel definition layer 130 is formed on the first pixel electrode 120. The pixel definition layer 130 has a plurality of pixel openings 132 to expose a portion of the surface of the first pixel electrode 120. Each of the pixel openings 132 is used to define a sub-pixel area. The separation pillar 140 is formed on the pixel definition layer 130 and is disposed between two adjacent first pixel electrodes 120. The separation pillar 140 is used to separate the cathodes of two adjacent sub-pixel areas, as shown in FIG. 1. The surface of the separation pillar 140 is higher than the surface of the adjacent sub-pixel area. Therefore, when the cathode is prepared on the surface of the display panel, the separation cathode 160b formed above the separation pillar 140 is disconnected from the cathode (the second pixel electrode 160) on the adjacent sub-pixel area, thereby achieving separation of the cathodes of the adjacent sub-pixel areas, and finally ensuring that each sub-pixel area can be normally driven. That is, the shape of the cathode is defined by a gap between adjacent separation pillars 140 and is complementary to the shape of the top surface of the separation pillar 140 to form a whole-surface structure.

Figure 2:
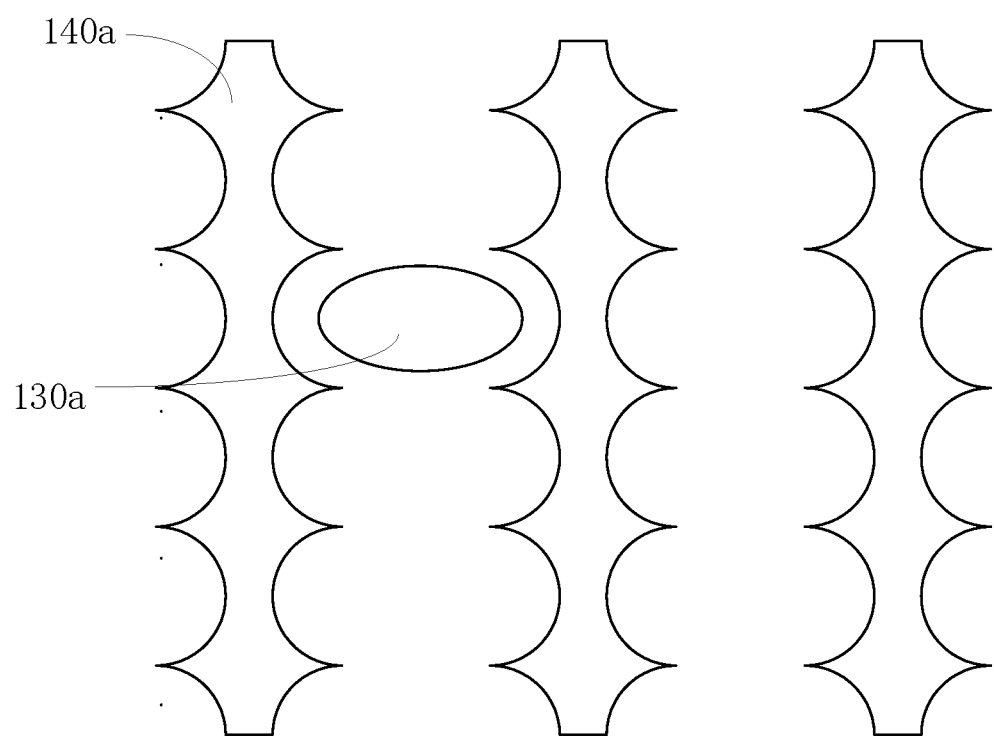
FIG. 2 is a top view of a first type of separation pillar in accordance with an exemplary embodiment.

FIG. 2 is a top view of a first type of separation pillar in accordance with an exemplary embodiment. As shown in FIG. 2, the separation pillar 140 includes a first type of separation pillar 140a. A width of the first type of separation pillar 140a changes continuously in an extending direction thereof. When external light passes through the first type of separation pillar 140a, diffraction fringes generated at positions of different maximum widths are different in position, so that the diffraction is less obvious, and an effect of improving diffraction is achieved.

Diffraction phenomenon occurs when external light passes through the separation pillar. Diffraction is a physical phenomenon in which a light wave propagates away from an original straight line when encountering an obstacle. Specifically, light waves propagate with varying degrees of bending and spreading after passing through obstacles such as slits, small holes, disks, or the like. When external light passes through the separation pillar, the separation pillar as an obstacle can cause diffraction when the light passes through, and the position of the diffraction fringe is determined by the maximum width of each position. A conventional separation pillar is generally in a strip shape, and has an inverted trapezoidal structure in a longitudinal section (i.e., a section perpendicular to the substrate 110). Specifically, the separation pillar has a bottom surface in contact with the substrate 110 and a top surface opposite to the bottom surface. The separation pillar is tapered from the top surface to the bottom surface such that the maximum width of the separation pillar appears on the top surface. The top surface is rectangular and has a constant width along the extending direction (that is, the width is the same in each position along the extending direction, which is the direction parallel to the substrate 110). The diffraction fringes generated at the position with the same width on the separation pillars have the same position, so that the diffraction effect is more obvious, and the normal operation of the photosensitive element located below the separation pillars is influenced finally, for example, the picture captured by the camera is distorted.

In the display panel in the aforementioned embodiments, the first type of separation pillars whose widths change continuously or intermittently in the extending direction are used, and the diffraction fringes with different positions are generated at positions of different maximum widths, so that the complex diffraction intensity distribution caused by the conventional separation pillars can be destroyed, the diffraction is relatively less obvious, and the effect of improving the diffraction is achieved.

In an exemplary embodiment, there may be a plurality of the first type of separation pillars 140. The plurality of first type of separation pillars 140a is arranged in parallel on the substrate 110. The first type of separation pillar 140a has a width within 5 μm to 100 μm. The minimum width of the first type of separation pillar 140a depends on the manufacturing process. Under the premise that the manufacturing process can be achieved, the width of the first type of separation pillar 140a can be less than or equal to 5 μm, or even less. A distance between two adjacent first type of separation pillars 140a depends on the design requirements of the dimension of the cathodes of two adjacent sub-pixel areas. By arranging the plurality of first type of separation pillars 140a in parallel on the substrate 110, the diffraction effect at various positions of the display panel can be uniformly improved, and the purpose of improving the diffraction effect of the display panel as a whole is achieved.

In an exemplary embodiment, as shown in FIG. 1, the separation pillar 140 includes a bottom surface 142 in contact with the substrate 110 and a top surface 144 opposite to the bottom surface 142. In the present embodiment, in a longitudinal section of the separation pillar 140, the top surface 144 has a width greater than or equal to the width of the bottom surface 142. At this time, in the same longitudinal section, the maximum width of the separation pillar 140 is located on the top surface 144, that is, the separation pillars 140 are tapered along the top surface 144 to the bottom surface 142 in a height direction. Therefore, the top surface 144 has a continuously changing width or an intermittently changing width along the extending direction.

In an exemplary embodiment, the bottom surface 142 of the separation pillar 140 is disposed parallel to the top surface 144, and the width of the bottom surface 142 is equal to or less than the width of the top surface 144 in the same cross section, so that the entire separation pillar 140 has a structure with a larger top and a smaller bottom. In an exemplary embodiment, the bottom surface 142 has substantially the same shape as the top surface 144, thereby ensuring that the separation pillars 140 have a continuously changing width or an intermittently changing width in the extending direction on any plane parallel to the substrate 110 (that is, at different height positions of the separation pillars 140), so as to ensure that no obvious diffraction effect is generated after light passes through the separation pillars 140.

In an exemplary embodiment, the first type of separation pillar 140a has a periodically changing width along its own extending direction. In other words, the width of the first type of separation pillar 140a does not change irregularly but changes regularly and periodically, so that the difficulty of the entire manufacturing process can be reduced. In an exemplary embodiment, one width changing period of the first type of separation pillar 140a corresponds to one sub-pixel area. At least one of two side edges of the top surface of the first type of separation pillar along the extending direction has a non-linear shape. The non-linear shape may be at least one of a polyline, an arc, a semicircle, and a wave shape.

In an exemplary embodiment, the non-linear shape is formed by connecting a plurality of semicircular edges having the same opening direction. As shown in FIG. 2, a semicircular opening is disposed towards the sub-pixel area 130a to reduce the influence on the pixel, and ensure the aperture ratio of the pixel while ensuring the brightness thereof to meet the requirements. In the present embodiment, the size of the diameter of the semicircle depends on the size of the pixel. The larger the pixel, the larger the diameter of the semicircle, and the smaller the pixel, the smaller the diameter of the semicircle. The minimum width of the top surface is determined by process limit capabilities. The adoption of the semicircular non-linear shape can lead the diffraction fringes not to be diffused towards one direction like the conventional strip-shaped separation pillar but to be diffused towards 360 degrees, thereby making the diffraction extremely unobvious and having better diffraction improvement effect. In addition, the edge area of the top surface corresponding to the pixel area is set to be semicircular, so that the influence on the pixel is minimum, the aperture ratio of the pixel is higher, and the brightness is higher.

Figure 3:
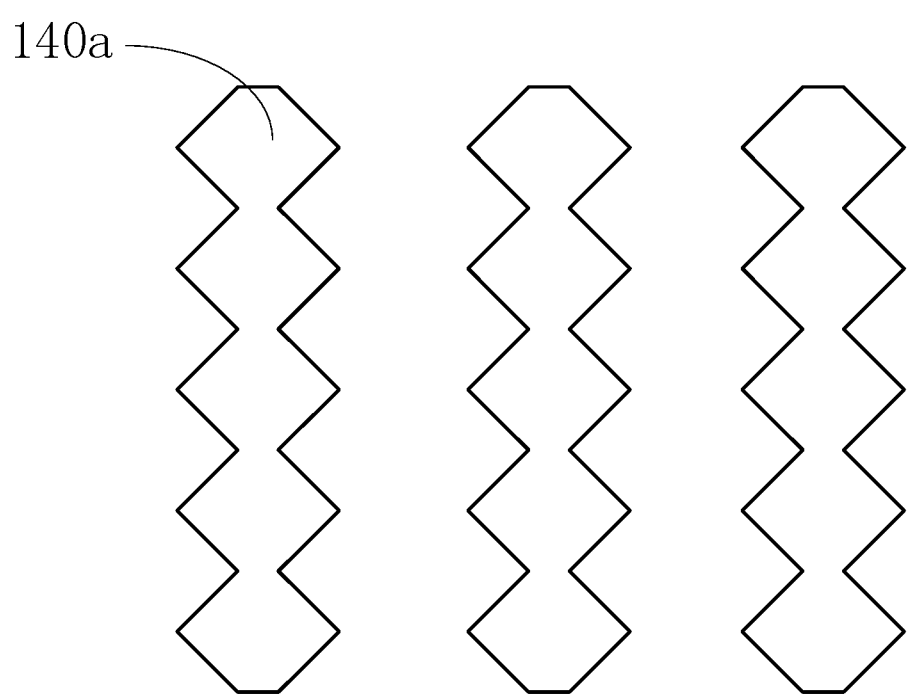
FIG. 3 is a top view of a first type of separation pillar in accordance with another exemplary embodiment.

FIG. 3 is a top view of a first type of separation pillar 140a, that is, a schematic view of the top surface thereof, in accordance with an exemplary embodiment. At this time, the non-linear shape is formed by connecting the edges of a plurality of polyline segments, so that the first type of separation pillar is ensured to have a changing width along the extending direction, and the diffraction effect is improved. In the present embodiment, the opening of each of the polyline segments is disposed towards the sub-pixel area to reduce the influence on the pixel and ensure the aperture ratio of the pixel while ensuring the brightness thereof to meet the requirements. In other embodiments, the polyline segment corresponding to each of the pixel areas may also be formed by more polyline segments, thereby forming a jagged edge.

Figure 4:
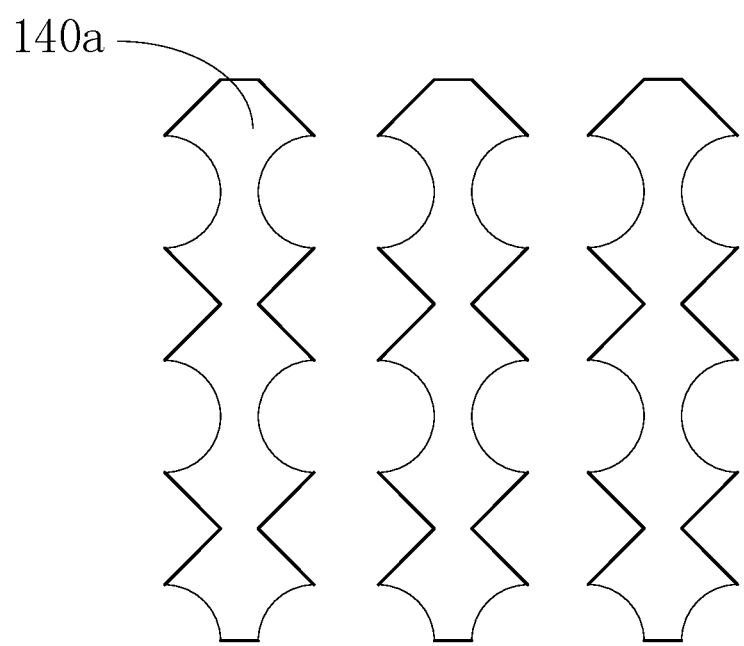
FIG. 4 is a top view of a first type of separation pillar in accordance with another exemplary embodiment.

In an exemplary embodiment, the side edge of the non-linear shape may also be in the shape of an ellipse or the like, or as shown in FIG. 4, the side edge of the non-linear shape is formed in an irregular shape formed by line segments and arcs alternately, and it is only necessary to ensure that the first type of separation pillar 140a has a changing width along the length direction, thereby ensuring that the slit diffraction caused by the conventional strip-shaped separation pillar can be destroyed and the effect of improving the diffraction can be achieved.

In the present embodiment, as shown in FIG. 1, the separation pillar 140 further includes two side surfaces 146 connected to the bottom surface 142 and the top surface 144. A projection of each of the side surfaces 146 on the substrate 110 coincides with a projection of the side edge of the top surface 144 on the substrate 110. In other words, the shape of the side surface 146 depends on the shape of the side edge of the top surface 144 and the shape of the side edge of the bottom surface 142. For example, when the side edge of the top surface 144 is a non-linear shape formed by a polyline segment, the side surface 146 is formed by connecting a plurality of planes at a certain angle. When the side edge of the top surface 144 is a non-linear shape formed by a semicircle, the side surface 146 is formed by connecting a plurality of arc surfaces, and a radius of curvature of the arc surface is the same as the diameter of the semicircle of the side edge of the top surface 144.

Figure 5:
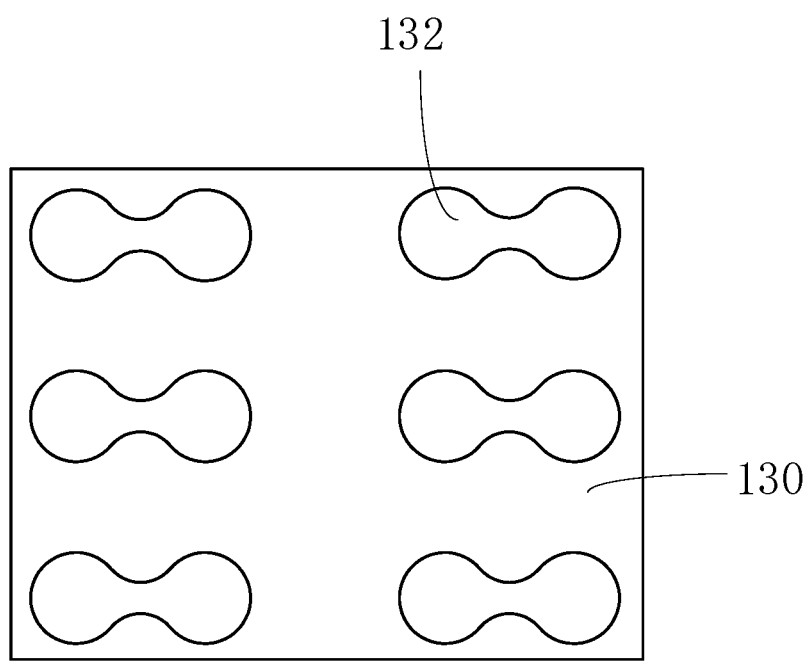
FIG. 5 is a schematic view of a pixel definition layer in accordance with an exemplary embodiment.

In an exemplary embodiment, the edges of pixel openings 132 in the pixel definition layer 130 are curved and are not parallel to each other. Specifically, the projection of the pixel opening 132 on the substrate 110 is one pattern unit or formed by connecting two or more pattern units. The pattern unit has a circular shape, elliptical shape, or dumbbell shape. FIG. 5 is a schematic view of a pixel definition layer 130 in accordance with an exemplary embodiment, on which a dumbbell-shaped pixel opening 132 is formed.

Figure 6:
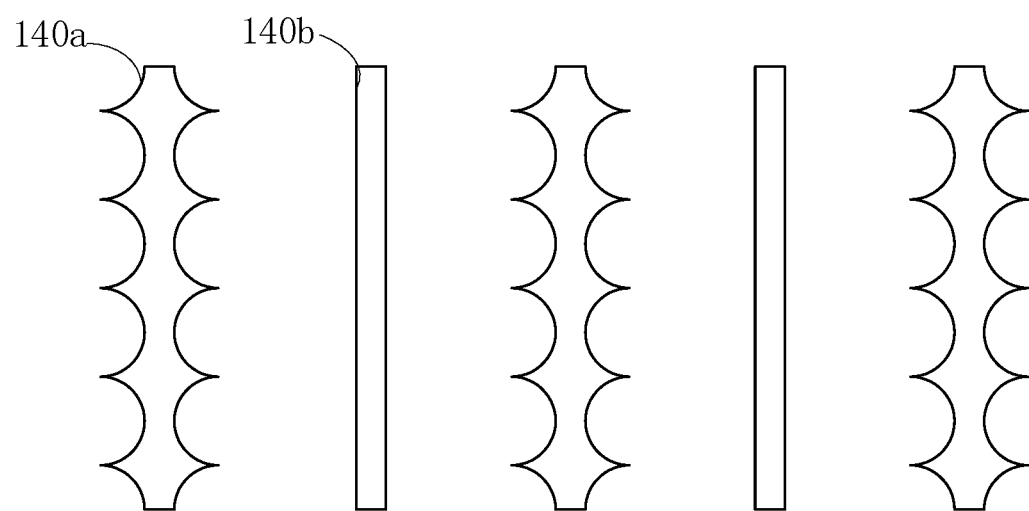
FIG. 6 is a schematic view of a first type of separation pillar and a second type of separation pillar disposed alternately in accordance with an exemplary embodiment.

In an exemplary embodiment, the separation pillar 140 further includes a second type of separation pillar 140b. The second type of separation pillar 140b has a strip shape. The second type of separation pillar 140b has a rectangular top surface and has an inverted trapezoidal structure in a longitudinal section. The first type of separation pillars 140a and the second type of separation pillars 140b are disposed alternately, as shown in FIG. 6. By disposing the two kinds of separation pillars alternately, the diffraction effect of the entire display panel at all positions can be made consistent.

In an exemplary embodiment, the separation pillars in the display panel are all first type of separation pillars 140a. The slit diffraction fringes generated by each of the first type of separation pillars 140a in different widths have different positions, so that the diffraction is less obvious, and a better effect of improving diffraction is achieved.

In an exemplary embodiment, the display panel may be a transparent or transflective display panel. The transparency of the display panel can be achieved by using various layers of materials with better light transmittance. For example, each layer of the display panel is made of a material having a light transmittance of greater than 90%, so that the light transmittance of the entire display panel may be greater than 70%. In addition, each layer of the display panel is made of a material having a light transmittance of greater than 95%, so that the light transmittance of the display panel is further improved, and even the light transmittance of the entire display panel is greater than 80%. Specifically, the conductive traces such as the cathode and the anode may be made of ITO, IZO, Ag+ITO, or Ag+IZO, etc., an insulating layer is preferably made of $SiO_2$, $SiN_x$, $Al_2O_3$, etc., and the pixel definition layer 130 is made of a highly transparent material.

The transparency of the display panel can also be achieved by other technical means, and structures of the aforementioned display panels can be applicable. The transparent or transflective display panel can display the picture normally when it is in an operation state. When the display panel is in other functional demand states, external light can irradiate the photosensitive device and the like disposed under the display panel through the display panel.

Figure 7:
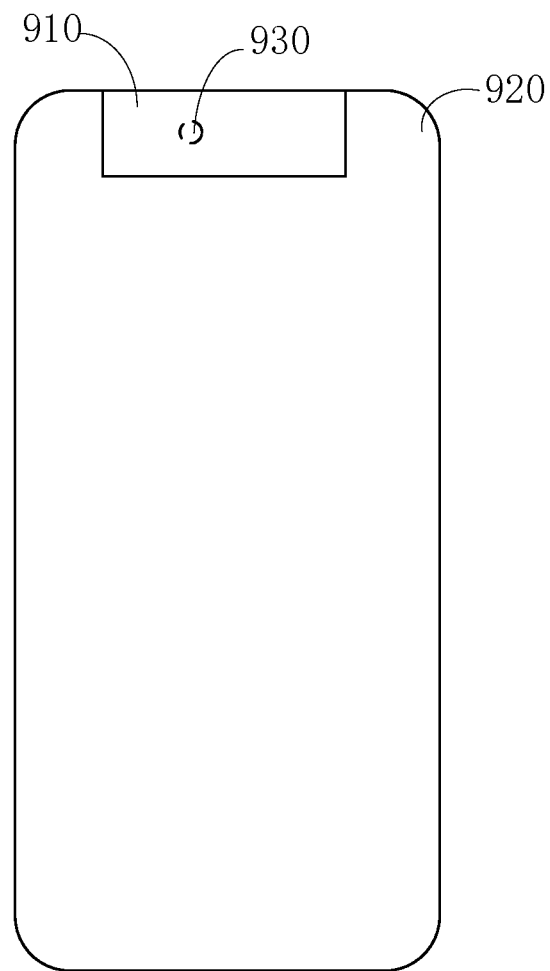
FIG. 7 is a schematic view of a display screen in accordance with an exemplary embodiment.

An exemplary embodiment of the present disclosure further provides a display screen. FIG. 7 is a schematic view of a display screen in accordance with an embodiment, and the display screen includes a first display area 910 and a second display area 920. A light transmittance of the first display area 910 is greater than a light transmittance of the second display area 920. A photosensitive device 930 may be disposed under the first display area 910. A first display panel is disposed in the first display area 910. The first display panel is a display panel as mentioned in any of the foregoing embodiments. A second display panel is disposed in the second display area 920. Both the first display area 910 and the second display area 920 are used to display a static or dynamic picture. Since the display panel in the foregoing embodiments is adopted in the first display area 910, when light passes through the display area, no obvious diffraction effect is generated, so that the photosensitive device 930 located under the first display area 910 can be ensured to work normally. The first display area 910 may display dynamic or static pictures normally when the photosensitive device 930 is not in operation, and the first display area 910 may be in a non-display state when the photosensitive device 930 is in operation, thereby ensuring that the photosensitive device 930 can perform light collection normally through the display panel. In other embodiments, the light transmittance of the first display area 910 may also be the same as the light transmittance of the second display area 920, so that the entire display panel has better light transmittance uniformity, ensuring a better display effect of the display panel.

In an embodiment, the first display panel disposed in the first display area 910 is a PMOLED display panel or an active-matrix organic light-emitting diode (AMOLED) display panel, and the second display panel disposed in the second display area 920 is an AMOLED display panel, thereby forming a full screen composed of a PMOLED display panel and an AMOLED display panel.

Figure 8:
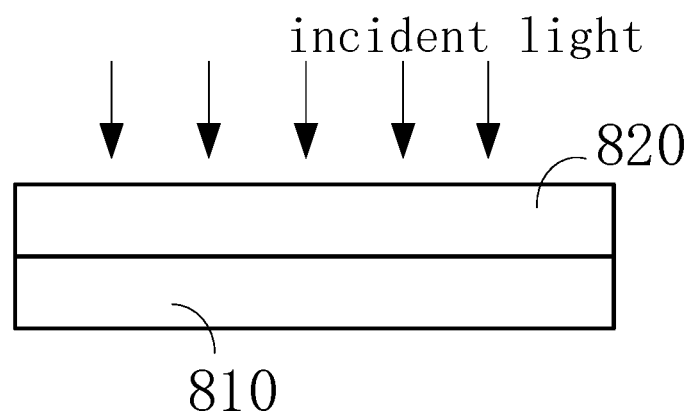
FIG. 8 is a schematic view of a display terminal in accordance with an exemplary embodiment.

Another embodiment of the present disclosure further provides a display terminal. FIG. 8 is a schematic view of a display terminal in accordance with an embodiment, and the display terminal includes a device body 810 and a display screen 820. The display screen 820 is disposed on the device body 810 and is interconnected with the device body 810. The display screen 820 may use a display screen in any of the foregoing embodiments to display a static or dynamic picture.

Figure 9:
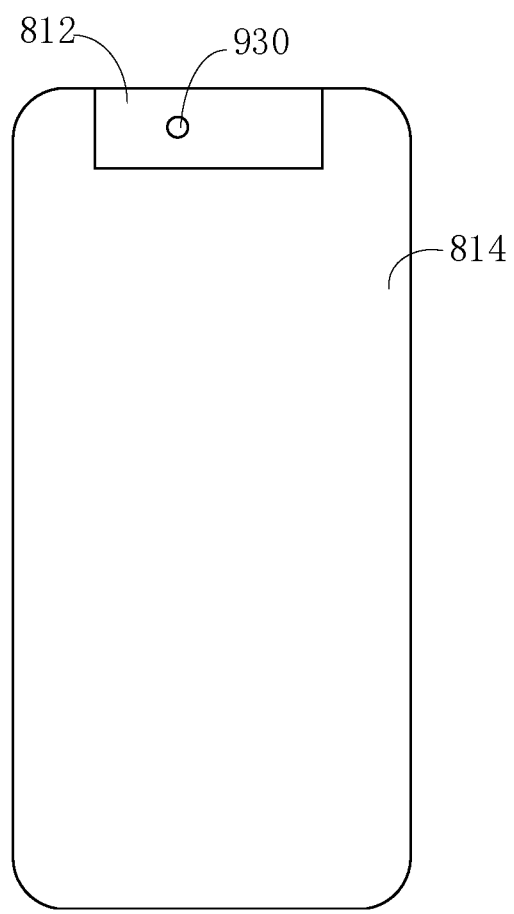
FIG. 9 is a schematic view of a device body in accordance with an exemplary embodiment.

FIG. 9 is a schematic view of the device body 810 in accordance with an embodiment. In the present embodiment, the device body 810 may be provided with a notched area 812 and a non-notched area 814. Photosensitive devices such as cameras 930, optical sensors, and the like may be disposed in the notched area 812. At this time, the display panel in the first display area of the display screen 820 is correspondingly attached to the notched area 814, so that the aforementioned photosensitive devices such as the camera 930, the optical sensor, and the like can perform operations such as external light collection and the like through the first display area. Since the display panel in the first display area can effectively improve the diffraction phenomenon generated by the transmission of the external light through the first display area, the quality of the image captured by the camera 930 on the display device can be effectively improved, the distortion of the captured image caused by diffraction can be avoided, and the accuracy and the sensitivity of the optical sensor to sense external light can also be improved.

The aforementioned electronic device may be a digital device such as a mobile phone, a tablet, a palmtop computer, an ipod, and the like.

Although the respective embodiments have been described one by one, it shall be appreciated that the respective embodiments will not be isolated. Those skilled in the art can apparently appreciate upon reading the disclosure of the present disclosure that the respective technical features involved in the respective embodiments can be combined arbitrarily between the respective embodiments as long as they have no collision with each other. The respective technical features mentioned in the same embodiment can also be combined arbitrarily as long as they have no collision with each other.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention. Therefore, the protection scope of the present invention shall be subject to the protection scope of the appended claims.

The invention claimed is:

1. A display panel, comprising:
   a substrate;
   a first pixel electrode overlaying the substrate;
   a pixel definition layer overlaying a side of the first pixel electrode away from the substrate and comprising a plurality of pixel openings to expose a portion of a surface of the first pixel electrode;
   a plurality of first type of separation pillars disposed on a side of the pixel definition layer away from the first pixel electrode, wherein a width of one of the first type of separation pillars changes continuously or intermittently in an extending direction of one of the first type of separation pillars, and the extending direction of one of the first type of separation pillars is parallel to the substrate, the width being a dimension of a projection of one of the first type of separation pillars on the substrate in a direction perpendicular to the extending direction of one of the first type of separation pillars; and
   a separation cathode positioned above separation pillars and being disconnected from the first pixel electrode.

2. The display panel according to claim 1, wherein the plurality of the first type of separation pillars is arranged in parallel on the substrate.

3. The display panel according to claim 1, wherein the display panel is a passive-matrix organic light-emitting diode (PMOLED) display panel.

4. The display panel according to claim 1, wherein the first pixel electrode comprises at least one selected from the group consisting of indium tin oxide, indium zinc oxide, silver-doped indium tin oxide, and silver-doped indium zinc oxide.

5. The display panel according to claim 1, further comprising a plurality of second type of separation pillars, wherein one of the second type of separation pillars comprises a strip shape, and the first type of separation pillars and the second type of separation pillars are disposed alternately.

6. The display panel according to claim 1, wherein:
the plurality of first type of separation pillars comprises a bottom surface in contact with the pixel definition layer and a top surface positioned opposite to the bottom surface;
in the direction perpendicular to the extending direction of one of the first type of separation pillars, a width of the top surface is greater than or equal to a width of the bottom surface; and
the top surface has a changing width along the extending direction of one of the first type of separation pillars.

7. The display panel according to claim 6, wherein at least one of two side edges of the top surface of one of the first type of separation pillars extending along the extending direction of one of the first type of separation pillars comprises a shape of at least one of a polyline segment, an arc, a semicircle, and a wave.

8. The display panel according to claim 7, wherein the bottom surface is parallel to the top surface, and a shape of the bottom surface is substantially the same as a shape of the top surface.

9. The display panel according to claim 7, wherein the plurality of first type of separation pillars further comprises two side surfaces connected to the top surface and the bottom surface, and a projection of each of the side surfaces on the substrate coincides with a projection of the side edge on the substrate.

10. The display panel according to claim 7, wherein the shape of the side edge is formed by connecting a plurality of semicircular edges having the same opening direction, and one of the edges comprises an opening facing a sub-pixel area.

11. The display panel according to claim 1, wherein a projection of one of the pixel openings on the substrate is a pattern unit or at least two pattern units connected to one another, and the pattern unit comprises a circular shape, elliptical shape, or dumbbell shape.

12. The display panel according to claim 1, further comprising a light emitting structure layer disposed on a side of the first pixel electrode away from the substrate and a second pixel electrode disposed on a side of the light emitting structure layer away from the first pixel electrode, an extending direction of the first pixel electrode being perpendicular to an extending direction of the second pixel electrode.

13. The display panel according to claim 12, wherein the second pixel electrode is made of at least one selected from the group consisting of indium tin oxide, indium zinc oxide, silver-doped indium tin oxide, and silver-doped indium zinc oxide.

14. A display screen, comprising:
a first display area configured to display a picture; and
the display panel according to claim 1 disposed in the first display area.

15. A display panel, comprising:
a substrate;
a first pixel electrode overlaying the substrate;
a pixel definition layer overlaying a side of the first pixel electrode away from the substrate and comprising a plurality of pixel openings to expose a portion of a surface of the first pixel electrode; and
a plurality of first type of separation pillars disposed on a side of the pixel definition layer away from the first pixel electrode, wherein a width of one of the first type of separation pillars changes continuously or intermittently in an extending direction of one of the first type of separation pillars, and the extending direction of one of the first type of separation pillars is parallel to the substrate, the width being a dimension of a projection of one of the first type of separation pillars on the substrate in a direction perpendicular to the extending direction of one of the first type of separation pillars;
wherein:
the plurality of first type of separation pillars comprises a bottom surface in contact with the pixel definition layer and a top surface positioned opposite to the bottom surface;
in the direction perpendicular to the extending direction of one of the first type of separation pillars, a width of the top surface is greater than or equal to a width of the bottom surface; and
the top surface has a changing width along the extending direction of one of the first type of separation pillars, at least one of two side edges of the top surface of one of the first type of separation pillars extending along the extending direction of one of the first type of separation pillars comprises a shape of at least one of a polyline segment, an arc, a semicircle, and a wave, the shape of the side edge is formed by connecting a plurality of semicircular edges having the same opening direction, and one of the edges comprises an opening facing a sub-pixel area.

16. A display panel, comprising:
a substrate;
a first pixel electrode overlaying the substrate;
a pixel definition layer overlaying a side of the first pixel electrode away from the substrate and comprising a plurality of pixel openings to expose a portion of a surface of the first pixel electrode; and
a plurality of first type of separation pillars disposed on a side of the pixel definition layer away from the first pixel electrode, wherein a width of one of the first type of separation pillars changes continuously or intermittently in an extending direction of one of the first type of separation pillars, and the extending direction of one of the first type of separation pillars is parallel to the substrate, the width being a dimension of a projection of one of the first type of separation pillars on the substrate in a direction perpendicular to the extending direction of one of the first type of separation pillars;
wherein the plurality of the first type of separation pillars is characterized by a contour with a continuously changing width that reduces diffraction.

* * * * *